United States Patent
Chen et al.

(10) Patent No.: US 10,043,745 B2
(45) Date of Patent: Aug. 7, 2018

(54) SEMICONDUCTOR PACKAGE DEVICES INTEGRATED WITH INDUCTOR

(71) Applicant: TAIWAN SEMICONDUCTOR MANUFACTURING COMPANY LTD., Hsinchu (TW)

(72) Inventors: Wei-Ting Chen, Tainan (TW);
In-Tsang Lin, Kaohsiung (TW);
Vincent Chen, Taipei (TW);
Chuei-Tang Wang, Taichung (TW);
Chen-Hua Yu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/088,128

(22) Filed: Apr. 1, 2016

(65) Prior Publication Data
US 2017/0287832 A1 Oct. 5, 2017

(51) Int. Cl.
| H01L 23/522 | (2006.01) |
| H01L 23/528 | (2006.01) |
| H01L 23/532 | (2006.01) |
| H01L 49/02 | (2006.01) |
| H01L 23/498 | (2006.01) |
| H01L 23/14 | (2006.01) |
| H01L 23/15 | (2006.01) |

(52) U.S. Cl.
CPC .... *H01L 23/5227* (2013.01); *H01L 23/49822* (2013.01); *H01L 23/528* (2013.01); *H01L 23/5329* (2013.01); *H01L 28/10* (2013.01); *H01L 23/145* (2013.01); *H01L 23/147* (2013.01); *H01L 23/15* (2013.01)

(58) Field of Classification Search
CPC .................... H01L 23/5227; H01L 23/49822
See application file for complete search history.

(56) References Cited

U.S. PATENT DOCUMENTS

| 8,448,100 | B1 | 5/2013 | Lin et al. |
| 8,631,372 | B2 | 1/2014 | Yu et al. |
| 8,669,780 | B2 | 3/2014 | Chi |
| 8,701,073 | B1 | 4/2014 | Fu et al. |
| 8,754,818 | B2 | 6/2014 | Yen et al. |
| 8,896,094 | B2 | 11/2014 | Yen et al. |
| 9,016,939 | B2 | 4/2015 | Chang et al. |
| 9,086,452 | B2 | 7/2015 | Wang et al. |
| 9,165,968 | B2 | 10/2015 | Chao et al. |
| 9,171,798 | B2 | 10/2015 | Lin et al. |
| 9,172,242 | B2 | 10/2015 | Chang et al. |
| 9,219,038 | B2 | 12/2015 | Horng et al. |
| 2012/0146757 | A1* | 6/2012 | Tsai .............. H01F 17/0013 336/200 |
| 2013/0193981 | A1 | 8/2013 | Chen et al. |
| 2013/0246990 | A1 | 9/2013 | Yen et al. |

(Continued)

*Primary Examiner* — Marc Armand
(74) *Attorney, Agent, or Firm* — WPAT, P.C., Intellectual Property Attorneys; Anthony King

(57) ABSTRACT

The present disclosure provides an inductor structure. The inductor structure, comprising a first surface, a second surface intersecting with the first surface, a first conductive pattern and a second conductive pattern. The first conductive pattern is formed on the first surface. The second conductive pattern is formed on the second surface. The first conductive pattern is connected with the second conductive pattern.

20 Claims, 8 Drawing Sheets

(56) References Cited

U.S. PATENT DOCUMENTS

| | | |
|---|---|---|
| 2013/0320553 A1 | 12/2013 | Kuo et al. |
| 2014/0126274 A1 | 5/2014 | Lee et al. |
| 2014/0167799 A1 | 6/2014 | Wang et al. |
| 2014/0195728 A1 | 7/2014 | Hsu et al. |
| 2014/0239427 A1 | 8/2014 | Huang et al. |
| 2014/0266273 A1 | 9/2014 | Wang et al. |
| 2016/0156390 A1* | 6/2016 | Kuroda ............... H01L 23/5227 455/41.1 |

* cited by examiner

US 10,043,745 B2

SEMICONDUCTOR PACKAGE DEVICES INTEGRATED WITH INDUCTOR

BACKGROUND

Near Field Communication (NFC) or wireless charging is a short-distance, high-frequency wireless communication technology and includes contact-free radio frequency identification (RFID) and interconnection technologies. The NFC technology can be applied to products such as a credit card, an ID card, a smart phone, and a tablet computer, so as to provide services such as identity verification and transaction payment. It would be desirable to improve communication quality and increase communication distance of NFC.

BRIEF DESCRIPTION OF THE DRAWINGS

Aspects of the present disclosure are best understood from the following detailed description when read with the accompanying drawings. It is noted that, in accordance with the practices in the industry, various features are not drawn to scale. In fact, the dimensions of the various features may be arbitrarily increased or reduced for clarity of discussion.

DETAILED DESCRIPTION

Figure 1A:
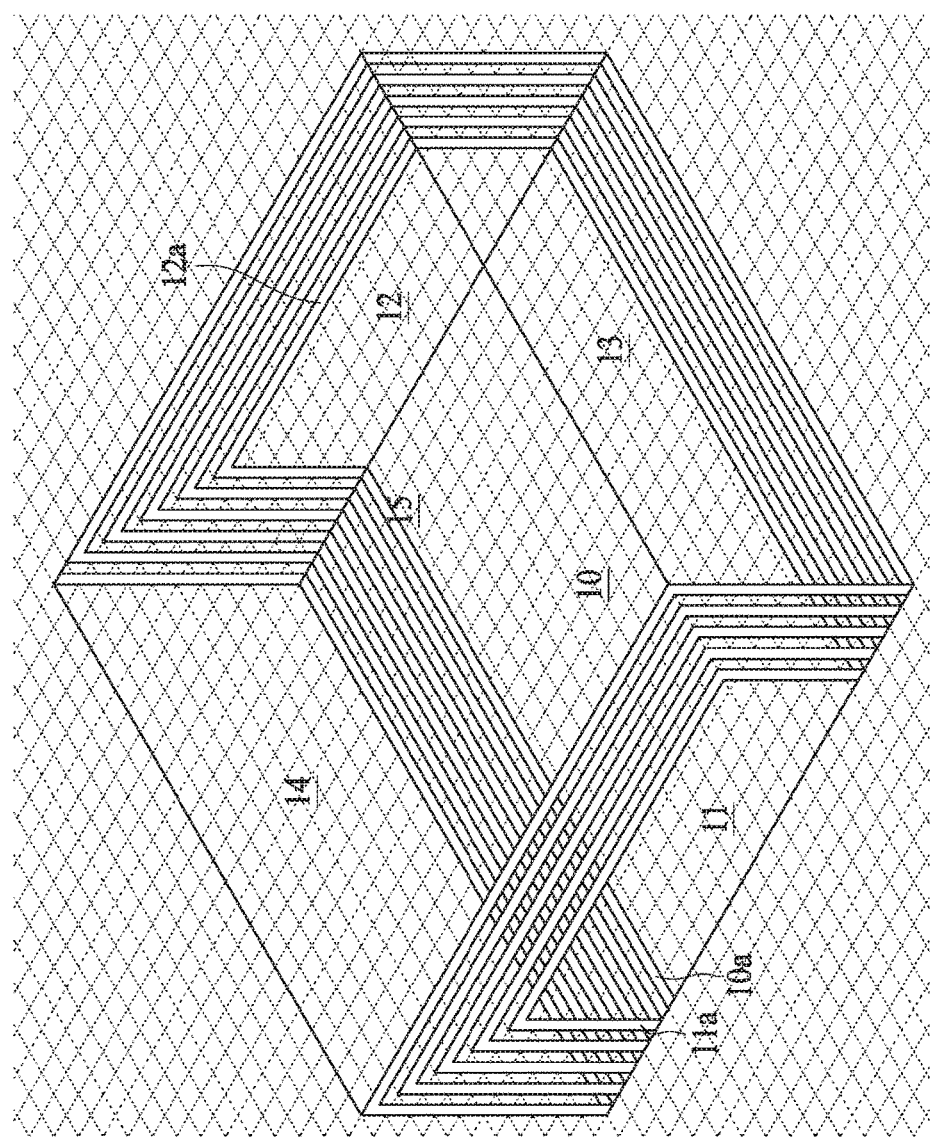
FIG. 1A is a three-dimensional (3D) view of a semiconductor package device, in accordance with some embodiments.

The following disclosure provides many different embodiments, or examples, for implementing different features of the present invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship with another element(s) or feature(s) as illustrated in the drawings. The spatially relative terms are intended to encompass different orientations of the device in use or operation in addition to the orientation depicted in the drawings. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the present invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. Each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1A illustrates a three-dimensional (3D) view of a semiconductor package device 1 in accordance with one embodiment of the present disclosure. The semiconductor package device 1 has six surfaces, a bottom surface 10, four lateral surfaces 11, 12, 13, 14 and a top surface 15. The top surface 15 is opposite to the bottom surface 10. Four lateral surfaces 11, 12, 13, 14 are extended between the top surface 15 and the bottom surface 10 and are substantially perpendicular to the top surface 15 and the bottom surface 10. The lateral surface 11 is opposite to the lateral surface 12 and substantially perpendicular to the lateral surfaces 13, 14.

The bottom surface 10 of the semiconductor package device 1 has a conductive pattern 10a. The conductive pattern 10a may be any conductive material, such as copper, nickel, aluminum, tungsten, titanium, any combination thereof, or the like. As shown in FIG. 1A, the conductive pattern 10a has a plurality of conductive metals. The conductive metals of the conductive pattern 10a are separated from each other and are substantially parallel to each other.

The lateral surface 11 of the semiconductor package device 1 has a conductive pattern 11a. The conductive pattern 11a may be any conductive material, such as copper, nickel, aluminum, tungsten, titanium, any combination thereof, or the like. The conductive pattern 11a has a plurality of separated conductive metals. Each conductive metal of the conductive pattern 11a are connected with the corresponding conductive metals of the conductive pattern 10a.

The lateral surface 12 of the semiconductor package device 1 has a conductive pattern 12a. The conductive pattern 12a may be any conductive material, such as copper, nickel, aluminum, tungsten, titanium, any combination thereof, or the like. The conductive pattern 12a has a plurality of separated conductive metals. Each conductive metal of the conductive pattern 12a are connected with the corresponding conductive metals of the conductive pattern 10a.

The conductive pattern 10a on the bottom surface 10, the conductive pattern 11a on the lateral surface 11 and the conductive pattern 12a on the lateral surface 12 jointly define a coil, an inductor or a transformer. In some embodiments of the present disclosure, the coil, the inductor or the transformer can be connected to circuits (not shown) integrated in the semiconductor package device 1 to form a transmitter or a receiver. Alternatively, the coil, the inductor or the transformer can be connected to circuits exterior to the semiconductor package device 1 to form a transmitter or a receiver.

Based on the electromagnetic induction theory, two inductors should be placed to be parallel to each other to get a maximum power interchange. For example, to let a receiver to receive a maximum power from a transmitter, the inductor of the receiver should be arranged to be parallel to that of the transmitter. That is, the inductor of the receiver should be aligned with that of the transmitter. In some embodiments, the semiconductor package device has a conductive pattern only on one surface, and thus the magnetic field of the inductor of the semiconductor package device can be only transmitted or received in one direction. Therefore, the inductor of the receiver should be aligned with that of the transmitter to receive the maximum magnetic field, resulting in that the design or the placement of the transmitter and the receiver is not flexible.

As shown in FIG. 1A, because the semiconductor package device 1 has conductive patterns on three surfaces, it can receive or transmit magnetic field in three directions (i.e., the direction perpendicular to the bottom surface 10, the direction perpendicular to the lateral surface 11 and the direction perpendicular to the lateral surface 12). In comparison with the semiconductor package device having only one surface with a conductive pattern, the semiconductor package device 1 shown in FIG. 1A can be design or placed more flexible to receive or transmit the magnetic field. In addition, the semiconductor package device 1 shown in FIG. 1A has better communication quality in the case that the transmitter and the receiver are misaligned.

Figure 1B:
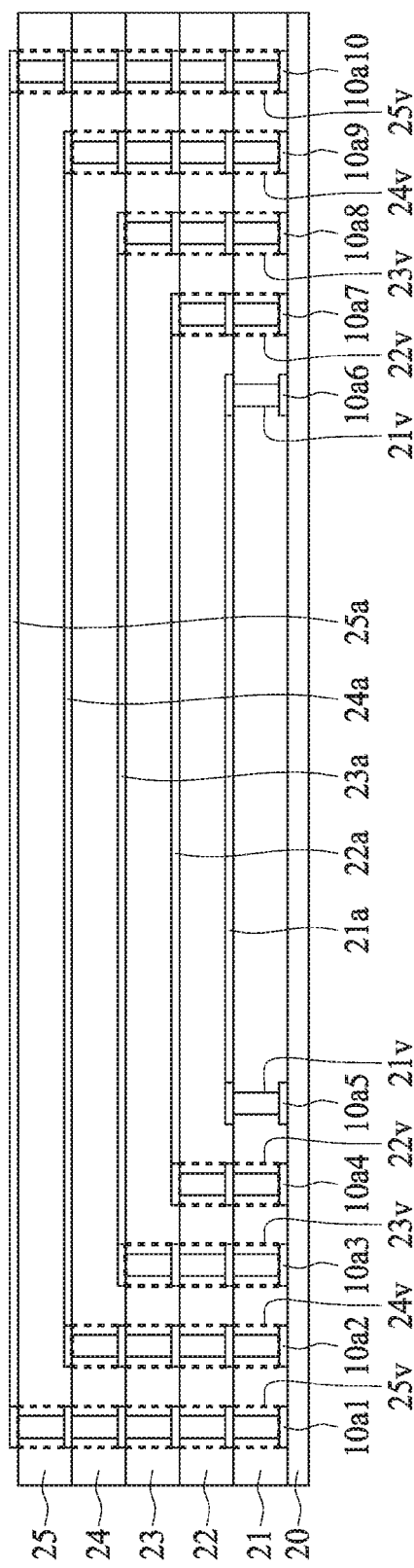
FIG. 1B is a side view of a semiconductor package device shown in FIG. 1A, in accordance with some embodiments.

FIG. 1B illustrates a side view from the lateral surface 11 of the semiconductor package device 1 in FIG. 1A. The semiconductor package device 1 comprises a plurality of stacked carriers 20, 21, 22, 23, 24, 25.

In some embodiments, the carrier 20 may be a substrate or a printed circuit board, such as a ceramic substrate, a paper-based copper foil laminate, a composite copper foil laminate, or a polymer-impregnated glass-fiber-based copper foil laminate. Alternatively, the carrier 20 may be any dielectric layer, such as boro-phospho-slilicate-glass (BPSG), silicon oxide, silicon nitride, silicon oxynitride, undoped Silicon Glass (USG), any combination thereof, or the like.

The conductive pattern 10a is on a top surface of the carrier 20. The conductive pattern 10a may be any conductive material, such as copper, nickel, aluminum, tungsten, titanium, any combination thereof, or the like. The conductive pattern has a plurality of conductive metals 10a1, 10a2, 10a3, 10a4, 10a5, 10a6, 10a7, 10a8, 10a9, 10a10, all of which are separated from each other.

The carrier 21 is located on the carrier 20 to encapsulate the conductive pattern 10a. The carrier 20 may be any dielectric layer, such as molding compounds, pre-impregnated composite fibers (e.g., pre-preg) BPSG, silicon oxide, silicon nitride, silicon oxynitride, USG, any combination thereof, or the like. Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

The conductive metal 21a is on a top surface of the carrier 21. The conductive pattern 21a may be any conductive material, such as copper, nickel, aluminum, tungsten, titanium, any combination thereof, or the like. In some embodiments, the conductive metal 21a is arranged in a direction substantially perpendicular to each conductive metal on the first carrier 20. Alternatively, the conductive metal 21a may be arranged in any direction based on the requirement of design. Through vias 21v penetrate the carrier 21 and electrically connect the conductive metal 21a to the conductive metals 10a5 and 10a6. In some embodiments, the conductive metal 21a can be a redistribution layer (RDL) over the carrier 21.

The carrier 22 is located on the carrier 21 to encapsulate the conductive pattern 21a. The carrier 22 may be any dielectric layer, such as molding compounds, pre-impregnated composite fibers (e.g., pre-preg) BPSG, silicon oxide, silicon nitride, silicon oxynitride, USG, any combination thereof, or the like. Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

The conductive metal 22a is on a top surface of the carrier 22. The conductive pattern 22a may be any conductive material, such as copper, nickel, aluminum, tungsten, titanium, any combination thereof, or the like. In some embodiments, the conductive metal 22a is arranged in a direction substantially perpendicular to each conductive metal on the first carrier 20. Alternatively, the conductive metal 22a may be arranged in any direction based on the requirement of design. Through vias 22v penetrate the carriers 22 and 21 and electrically connect the conductive metal 22a to the conductive metals 10a4 and 10a7. In some embodiments, the conductive metal 22a can be a redistribution layer (RDL) over the carrier 22.

The carrier 23 is located on the carrier 22 to encapsulate the conductive pattern 22a. The carrier 23 may be any dielectric layer, such as molding compounds, pre-impregnated composite fibers (e.g., pre-preg) BPSG, silicon oxide, silicon nitride, silicon oxynitride, USG, any combination thereof, or the like. Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

The conductive metal 23a is on a top surface of the carrier 23. The conductive pattern 23a may be any conductive material, such as copper, nickel, aluminum, tungsten, titanium, any combination thereof, or the like. In some embodiments, the conductive metal 23a is arranged in a direction substantially perpendicular to each conductive metal on the first carrier 20. Alternatively, the conductive metal 23a may be arranged in any direction based on the requirement of design. Through vias 23v penetrate the carriers 23, 22 and 21 and electrically connect the conductive metal 23a to the conductive metals 10a3 and 10a8. In some embodiments, the conductive metal 23a can be a redistribution layer (RDL) over the carrier 23.

The carrier 24 is located on the carrier 23 to encapsulate the conductive pattern 23a. The carrier 24 may be any dielectric layer, such as molding compounds, pre-impregnated composite fibers (e.g., pre-preg) BPSG, silicon oxide, silicon nitride, silicon oxynitride, USG, any combination thereof, or the like. Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

The conductive metal 24a is on a top surface of the carrier 24. The conductive pattern 24a may be any conductive material, such as copper, nickel, aluminum, tungsten, titanium, any combination thereof, or the like. In some embodiments, the conductive metal 24a is arranged in a direction substantially perpendicular to each conductive metal on the first carrier 20. Alternatively, the conductive metal 24a may be arranged in any direction based on the requirement of design. Through vias 24v penetrate the carriers 24, 23, 22 and 21 and electrically connect the conductive metal 24a to the conductive metals 10a2 and 10a9. In some embodiments, the conductive metal 24a can be a redistribution layer (RDL) over the carrier 24.

The carrier 25 is located on the carrier 24 to encapsulate the conductive pattern 24a. The carrier 25 may be any dielectric layer, such as molding compounds, pre-impregnated composite fibers (e.g., pre-preg) BPSG, silicon oxide, silicon nitride, silicon oxynitride, USG, any combination thereof, or the like. Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

The conductive metal 25a is on a top surface of the carrier 25. The conductive pattern 25a may be any conductive material, such as copper, nickel, aluminum, tungsten, titanium, any combination thereof, or the like. In some embodiments, the conductive metal 25a is arranged in a direction substantially perpendicular to each conductive metal on the first carrier 20. Alternatively, the conductive metal 25a may be arranged in any direction based on the requirement of design. Through vias 25v penetrate the carriers 25, 24, 23, 22 and 21 and electrically connect the conductive metal 25a to the conductive metals 10a1 and 10a10. In some embodiments, the conductive metal 25a can be a redistribution layer (RDL) over the carrier 25.

The conductive metals 21a, 22a, 23a, 24a, 25a and the through vias 21v, 22v, 23v, 24v, 25v jointly form the conductive pattern 11a on the lateral surface 11 of the semiconductor package device 1 shown in FIG. 1A. The through vias 21v, 22v, 23v, 24v, 25v are conductive materials arranged vertically to connect conductive metals of adjacent layers, and may be referred to conductive contacts herein. In some embodiments, a semiconductor chip or a semiconductor die is embedded in one or more of the carriers 21, 22, 23, 24, 25 and electrically coupled to the corresponding conductive metals 21a, 22a, 23a, 24a, 25a or through vias 21v, 22v, 23v, 24v, 25v, according to various packaging designs. As mentioned above, since the semiconductor package device 1 has conductive patterns on the bottom surface 10 and lateral surfaces 11, 12, it can receive or transmit magnetic field in three directions. In comparison with the semiconductor package device having only one surface with a conductive pattern, the semiconductor package device 1 shown in FIG. 1A can be design or placed more flexible to receive or transmit the magnetic field. In addition, the semiconductor package device 1 shown in FIG. 1A has better communication quality in the case that the transmitter and the receiver are misaligned.

Figure 2:
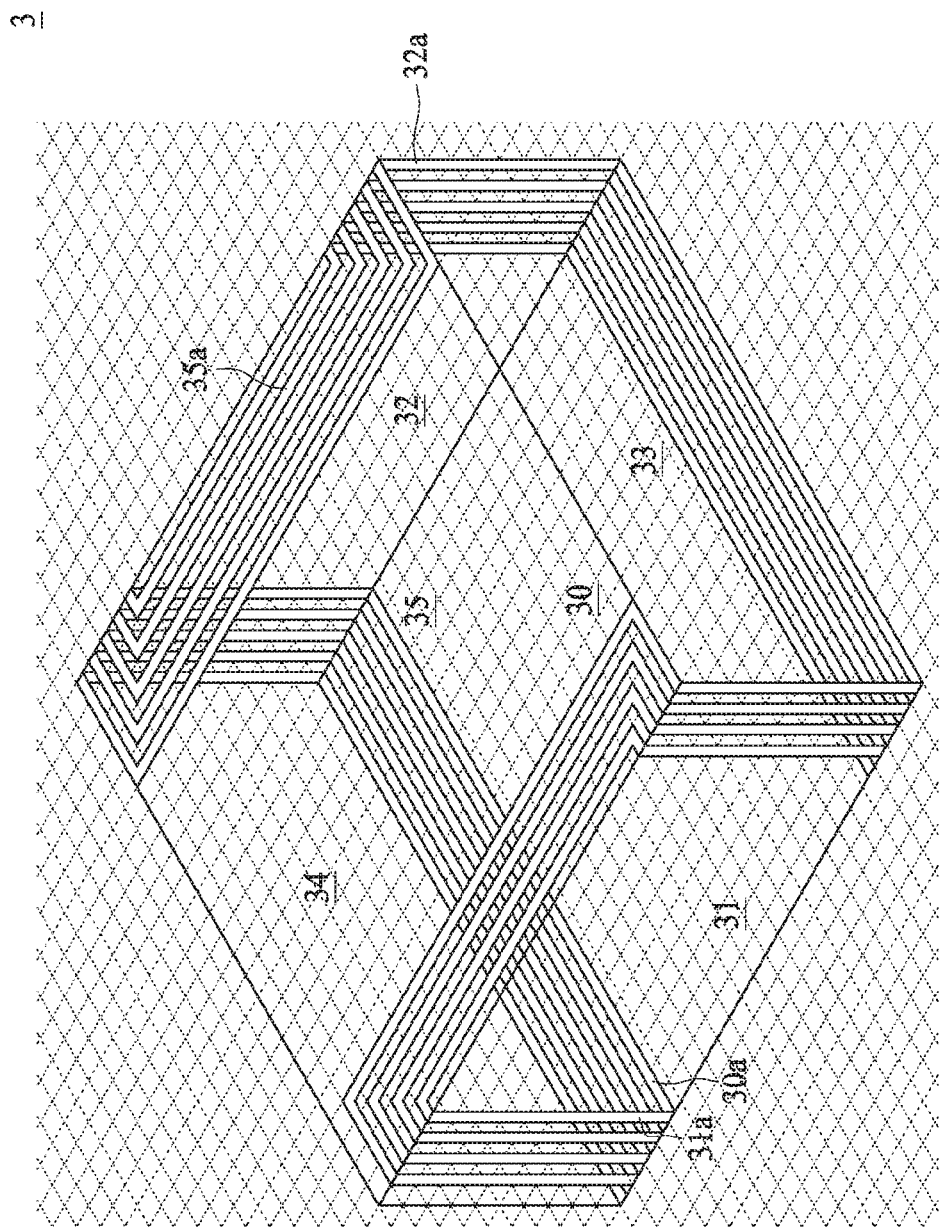
FIG. 2 is a 3D view of a semiconductor package device, in accordance with some embodiments.

FIG. 2 illustrates a three-dimensional view of a semiconductor package device 3 in accordance with one embodiment of the present disclosure. The semiconductor package device 3 has six surfaces, a bottom surface 30, four lateral surfaces 31, 32, 33, 34 and a top surface 35. The top surface 35 is opposite to the bottom surface 30. Four lateral surfaces 31, 32, 33, 34 are extended between the top surface 35 and the bottom surface 30 and are substantially perpendicular to the top surface 35 and the bottom surface 30. The lateral surface 31 is opposite to the lateral surface 32 and substantially perpendicular to the lateral surfaces 33, 34.

The bottom surface 30 of the semiconductor package device 3 has a conductive pattern 30a. The conductive pattern 30a may be any conductive material, such as copper, nickel, aluminum, tungsten, titanium, any combination thereof, or the like. As shown in FIG. 2, the conductive pattern 30a has a plurality of conductive metals. The conductive metals of the conductive pattern 30a are separated from each other and are substantially parallel to each other.

The lateral surface 31 of the semiconductor package device 3 has a conductive pattern 31a. The conductive pattern 31a may be any conductive material, such as copper, nickel, aluminum, tungsten, titanium, any combination thereof, or the like. The conductive pattern 31a has a plurality of conductive metals. The conductive metals of the conductive pattern 31a are separated from each other and are parallel to each other. Each conductive metal of the conductive pattern 31a is connected with the corresponding conductive metal of the conductive pattern 30a.

The lateral surface 32 of the semiconductor package device 3 has a conductive pattern 32a. The conductive pattern 32a may be any conductive material, such as copper, nickel, aluminum, tungsten, titanium, any combination thereof, or the like. The conductive pattern 32a has a plurality of conductive metals. The conductive metals of the conductive pattern 32a are separated from each other and are parallel to each other. Each conductive metal of the conductive pattern 32a is connected with the corresponding conductive metal of the conductive pattern 20a.

The top surface 35 of the semiconductor package device 3 has a conductive pattern 35a. The conductive pattern 35a may be any conductive material, such as copper, nickel, aluminum, tungsten, titanium, any combination thereof, or the like. The conductive pattern 35a has a plurality of separated conductive metals. Each conductive metal of the conductive pattern 35a are connected with the corresponding conductive metal of the conductive pattern 30a and the corresponding conductive metal of the conductive pattern 31a.

The conductive pattern 30a on the bottom surface 30, the conductive pattern 31a on the lateral surface 31, the conductive pattern 32a on the lateral surface 32 and the conductive pattern 35a on the top surface 35 jointly define a coil, an inductor or a transformer. In some embodiments of the present disclosure, the coil, the inductor or the transformer can be connected to circuits (not shown) integrated in the semiconductor package device 3 to form a transmitter or a receiver. Alternatively, the coil, the inductor or the transformer can be connected to circuits exterior to the semiconductor package device 3 to form a transmitter or a receiver.

As shown in FIG. 2, because the semiconductor package device 3 has conductive patterns on four surfaces, it can receive or transmit magnetic field in four directions (i.e., the direction perpendicular to the bottom surface 30, the direction perpendicular to the lateral surface 31, the direction perpendicular to the lateral surface 32 and the direction perpendicular to the top surface 35). In comparison with the semiconductor package device having only one surface with a conductive pattern, the semiconductor package device 3 shown in FIG. 2 can be design or placed more flexible to receive or transmit the magnetic field. In addition, the semiconductor package device 3 shown in FIG. 2 has better communication quality in the case that the transmitter and the receiver are misaligned.

Figure 3:
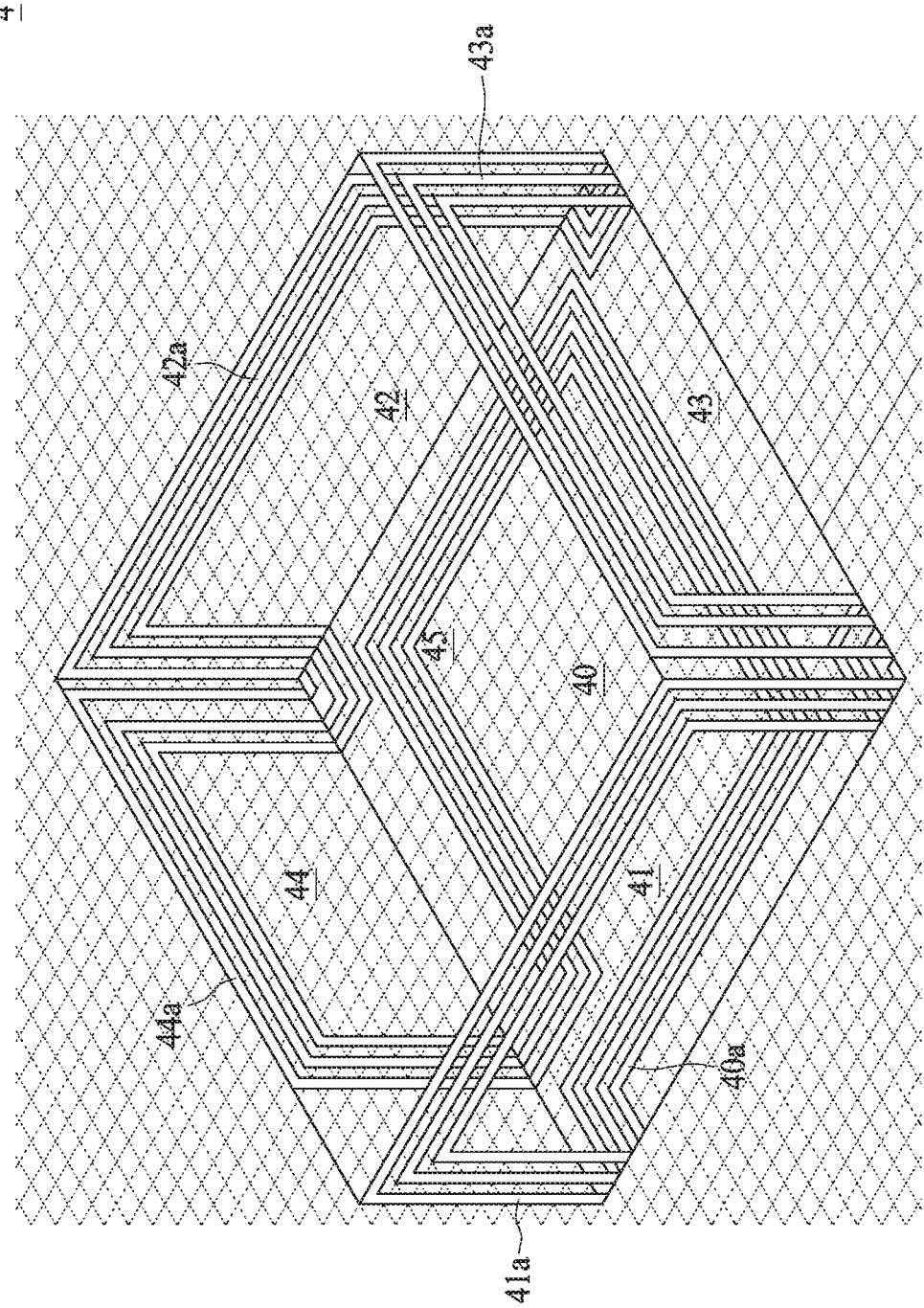
FIG. 3 is a 3D view of a semiconductor package device, in accordance with some embodiments.

FIG. 3 illustrates a three-dimensional view of a semiconductor package device 4 in accordance with one embodiment of the present disclosure. The semiconductor package device 4 has six surfaces, a bottom surface 40, four lateral surfaces 41, 42, 43, 44 and a top surface 45. The top surface 45 is opposite to the bottom surface 40. Four lateral surfaces 41, 42, 43, 44 are extended between the top surface 45 and the bottom surface 40 and are substantially perpendicular to the top surface 45 and the bottom surface 40. The lateral surface 41 is opposite to the lateral surface 42 and substantially perpendicular to the lateral surfaces 43, 44.

The bottom surface 40 of the semiconductor package device 4 has a conductive pattern 40a. The conductive pattern 40a may be any conductive material, such as copper, nickel, aluminum, tungsten, titanium, any combination thereof, or the like. As shown in FIG. 3, the conductive pattern 40a has a plurality of separated conductive metals.

The lateral surface 41 of the semiconductor package device 4 has a conductive pattern 41a. The conductive pattern 41a may be any conductive material, such as copper, nickel, aluminum, tungsten, titanium, any combination thereof, or the like. The conductive pattern 41a has a plurality of separated conductive metals. Each conductive metal of the conductive pattern 41a is connected with the corresponding conductive metals of the conductive pattern 40a.

The lateral surface 42 of the semiconductor package device 4 has a conductive pattern 42a. The conductive pattern 42a may be any conductive material, such as copper, nickel, aluminum, tungsten, titanium, any combination thereof, or the like. The conductive pattern 42a has a plurality of separated conductive metals. Each conductive metal of the conductive pattern 42a is connected with the corresponding conductive metals of the conductive pattern 40a.

The lateral surface 43 of the semiconductor package device 4 has a conductive pattern 43a. The conductive pattern 43a may be any conductive material, such as copper, nickel, aluminum, tungsten, titanium, any combination thereof, or the like. The conductive pattern 43a has a plurality of separated conductive metals. Each conductive metal of the conductive pattern 43a is connected with the corresponding conductive metals of the conductive pattern 40a.

The lateral surface 44 of the semiconductor package device 4 has a conductive pattern 44a. The conductive pattern 44a may be any conductive material, such as copper, nickel, aluminum, tungsten, titanium, any combination thereof, or the like. The conductive pattern 44a has a plurality of separated conductive metals. Each conductive metal of the conductive pattern 44a is connected with the corresponding conductive metals of the conductive pattern 40a.

The conductive pattern 40a on the bottom surface 40 and the conductive pattern 41a, 42a, 43a, 44a on the lateral surfaces 31, 32, 33, 34 jointly define a coil, an inductor or a transformer. In some embodiments of the present disclosure, the coil, the inductor or the transformer can be connected to circuits (not shown) integrated in the semiconductor package device 4 to form a transmitter or a receiver. Alternatively, the coil, the inductor or the transformer can be connected to circuits exterior to the semiconductor package device 4 to form a transmitter or a receiver.

As shown in FIG. 3, because the semiconductor package device 4 has conductive patterns on five surfaces, it can receive or transmit magnetic field in five directions (i.e., the direction perpendicular to the bottom surface 40 and the direction perpendicular to the lateral surfaces 41, 42, 43, 44). In comparison with the semiconductor package device having only one surface with a conductive pattern, the semiconductor package device 4 shown in FIG. 3 can be design or placed more flexible to receive or transmit the magnetic field. In addition, the semiconductor package device 4 shown in FIG. 3 has better communication quality in the case that the transmitter and the receiver are misaligned.

Figure 4:
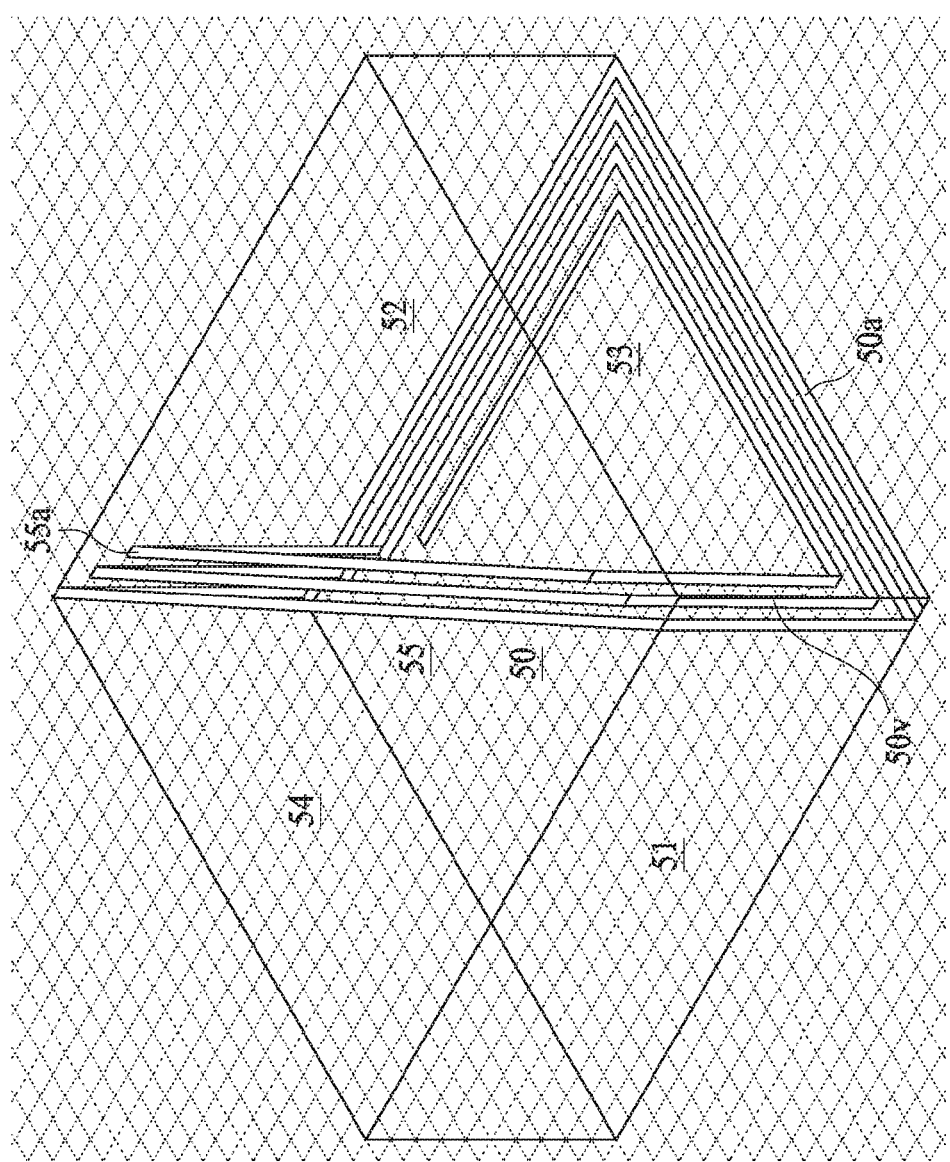
FIG. 4 is a 3D view of a semiconductor package device, in accordance with some embodiments.

FIG. 4 illustrates a three-dimensional view of a semiconductor package device 5 in accordance with one embodiment of the present disclosure. The semiconductor package device 5 has six surfaces, a bottom surface 50, four lateral surfaces 51, 52, 53, 54 and a top surface 55. The top surface 55 is opposite to the bottom surface 50. Four lateral surfaces 51, 52, 53, 54 are extended between the top surface 55 and the bottom surface 50 and are substantially perpendicular to the top surface 55 and the bottom surface 50. The lateral surface 51 is opposite to the lateral surface 52 and substantially perpendicular to the lateral surfaces 53, 54.

The bottom surface 50 of the semiconductor package device 5 has a conductive pattern 50a. The conductive pattern 50a may be any conductive material, such as copper, nickel, aluminum, tungsten, titanium, any combination thereof, or the like. As shown in FIG. 4, the conductive pattern 50a has a plurality of separated conductive metals.

The top surface 55 of the semiconductor package device 5 has a conductive pattern 55a. The conductive pattern 55a may be any conductive material, such as copper, nickel, aluminum, tungsten, titanium, any combination thereof, or the like. The conductive pattern 5a has a plurality of separated conductive metals.

Through vias 50v penetrate the semiconductor package device 5 and connect each conductive metal of the conductive pattern 55a with the corresponding conductive metal of the conductive pattern 50a. In some embodiments, the through vias 50v are parallel to each other.

The conductive pattern 50a on the bottom surface 50, the conductive pattern 55a on the top surface 55 and the through vias 50v jointly define a coil, an inductor or a transformer. In some embodiments of the present disclosure, the coil, the inductor or the transformer can be connected to circuits (not shown) integrated in the semiconductor package device 5 to form a transmitter or a receiver. Alternatively, the coil, the inductor or the transformer can be connected to circuits exterior to the semiconductor package device 5 to form a transmitter or a receiver.

As shown in FIG. 4, because the semiconductor package device 5 has conductive patterns on two surfaces and through vias penetrating the semiconductor package device 5, it can receive or transmit magnetic field in three directions (i.e., the direction perpendicular to the bottom surface 50, the direction perpendicular to the top surface 55 and the direction perpendicular to the surface defined by the through vias 50v). In comparison with the semiconductor package device having only one surface with a conductive pattern, the semiconductor package device 5 shown in FIG. 4 can be design or placed more flexible to receive or transmit the magnetic field. In addition, the semiconductor package device 5 shown in FIG. 4 has better communication quality in the case that the transmitter and the receiver are misaligned.

Figure 5:
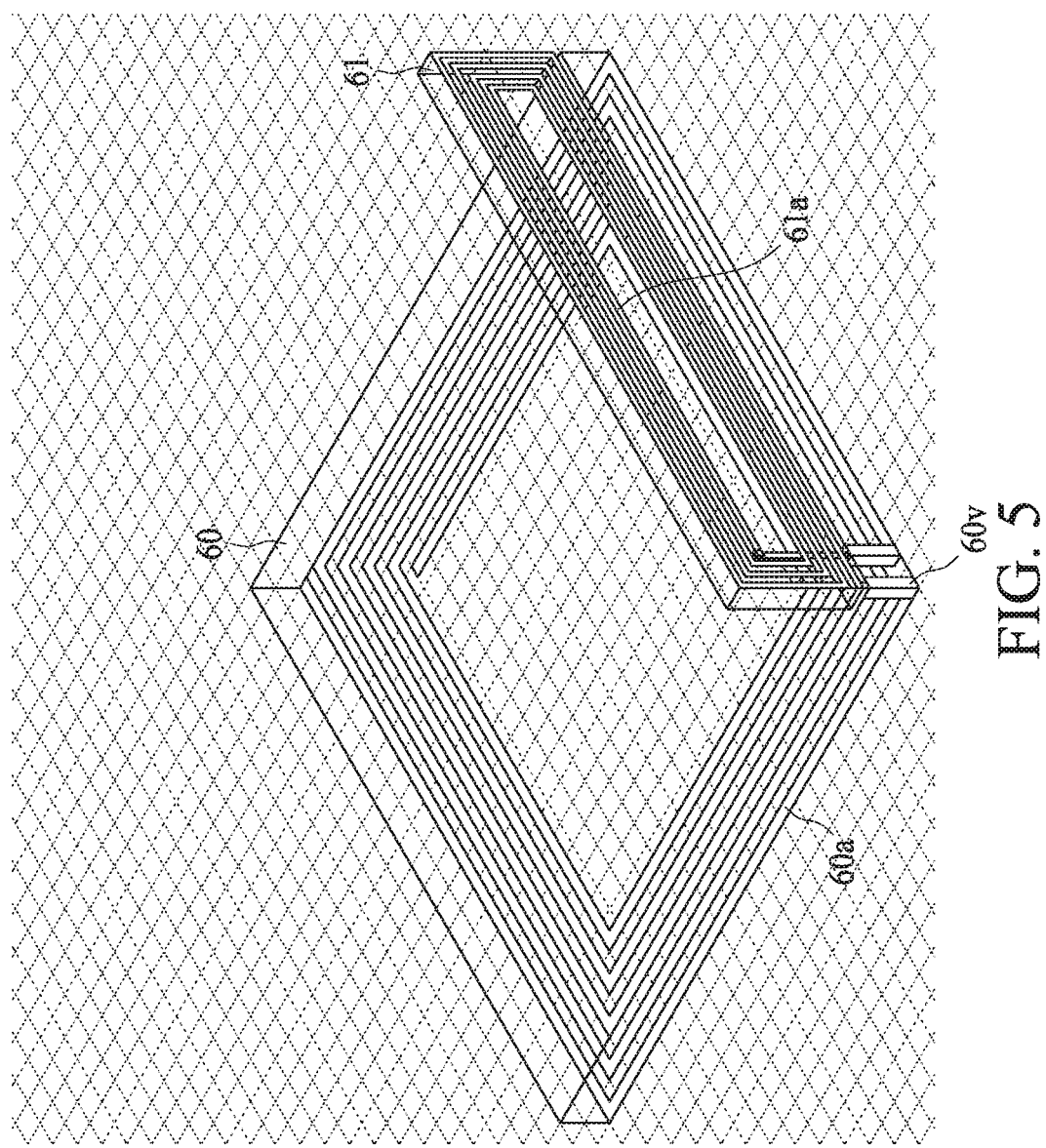
FIG. 5 is a 3D view of a semiconductor package device, in accordance with some embodiments.

FIG. 5 illustrates a three-dimensional view of a semiconductor package device 6 in accordance with one embodiment of the present disclosure. The semiconductor package device 6 has two separated package devices 60, 61.

The package device 60 has a conductive pattern 60a on the bottom surface. The conductive pattern 60a may be any conductive material, such as copper, nickel, aluminum, tungsten, titanium, any combination thereof, or the like. The conductive pattern 60a may be a coil, an inductor or a transformer.

The package device 61 is located on a top surface of the package device 60. The package device 61 has a conductive pattern 61a on one surface. The conductive pattern 61a on the package device 61 is substantially perpendicular to the conductive pattern 60a on the package device 60. The conductive pattern 61a may be any conductive material, such as copper, nickel, aluminum, tungsten, titanium, any combination thereof, or the like. The conductive pattern 61a may be a coil, an inductor or a transformer. The conductive pattern 61a is connected to the conductive pattern 60a by through vias 60v. The through vias 60v are conductive materials arranged vertically to connect conductive patterns on adjacent package devices, and may be referred to conductive contacts herein. In some embodiments of the present disclosure, the conductive patterns 60a, 61 a can be connected to circuits (not shown) integrated in the semiconductor package device 6 to form a transmitter or a receiver. Alternatively, the conductive patterns 60a, 61a can be connected to circuits exterior to the semiconductor package device 6 to form a transmitter or a receiver.

As shown in FIG. 5, the semiconductor package device 6 can receive or transmit magnetic field in two directions (i.e., the direction perpendicular to the surface defined by the conductive pattern 60a and the surface defined by the conductive pattern 61a). In comparison with the semiconductor package device having only one surface with a conductive pattern, the semiconductor package device 6 shown in FIG. 5 can be design or placed more flexible to receive or transmit the magnetic field. In addition, the semiconductor package device 6 shown in FIG. 5 has better communication quality in the case that the transmitter and the receiver are misaligned.

Figure 6:
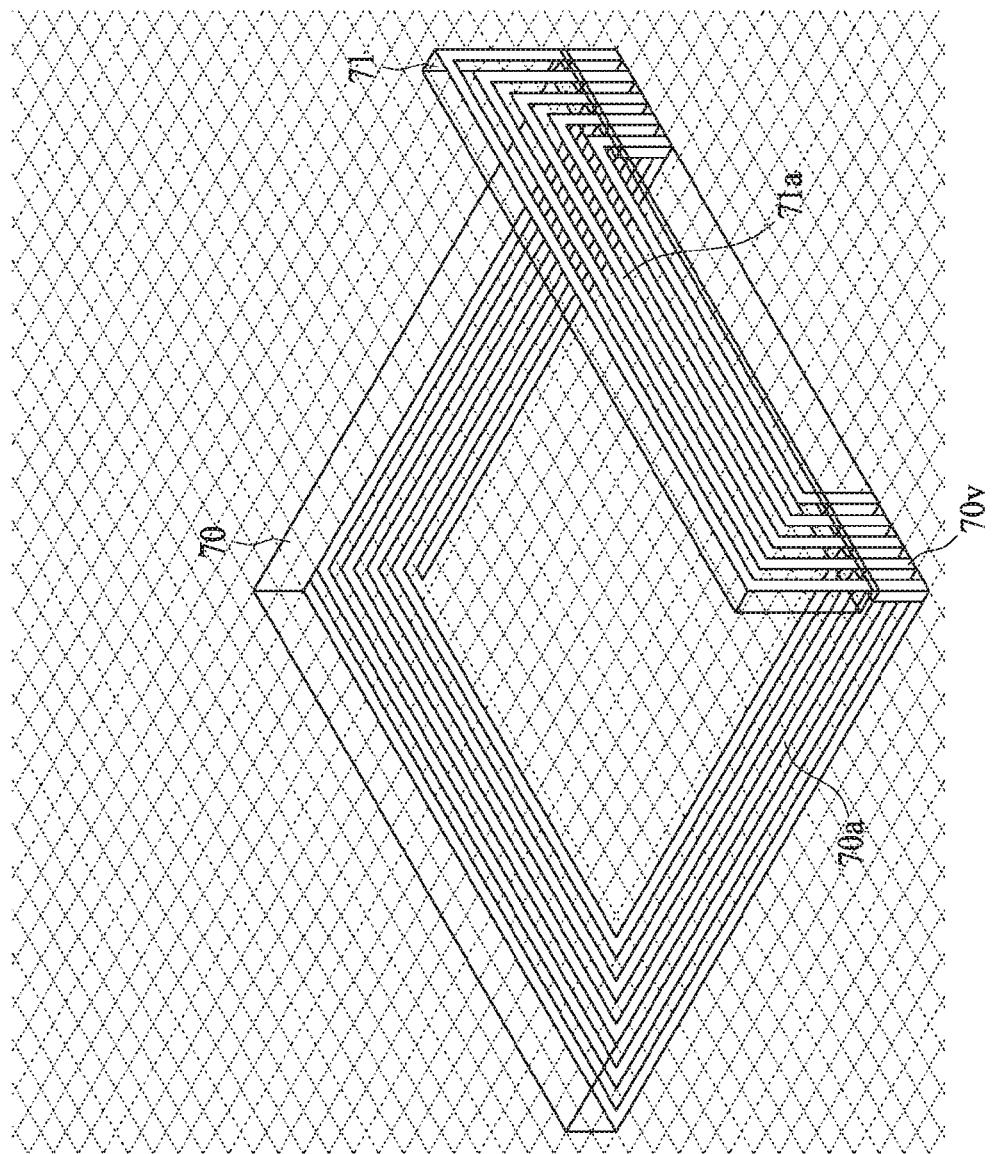
FIG. 6 is a 3D view of a semiconductor package device, in accordance with some embodiments.

FIG. 6 illustrates a three-dimensional view of a semiconductor package device 7 in accordance with one embodiment of the present disclosure. The semiconductor package device 6 has two separated package devices 70, 71.

The package device 70 has a conductive pattern 70a on the bottom surface. The conductive pattern 70a may be any conductive material, such as copper, nickel, aluminum, tungsten, titanium, any combination thereof, or the like. The conductive pattern 70a has a plurality of separated conductive metals.

The package device 71 is located on a top surface of the package device 70. The package device 71 has a conductive pattern 71a on one surface. The conductive pattern 71a on the package device 71 is substantially perpendicular to the conductive pattern 70a on the package device 70. The conductive pattern 71a may be any conductive material, such as copper, nickel, aluminum, tungsten, titanium, any combination thereof, or the like. The conductive pattern 71a has a plurality of separated conductive metals, each connected to the corresponding conductive metal of the conductive pattern 70a by through vias 70v. The through vias 70v are conductive materials arranged vertically to connect conductive patterns on adjacent package devices, and may be referred to conductive contacts herein.

The conductive pattern 70a, the conductive pattern 71a and the through vias 70v jointly define a coil, an inductor or a transformer. In some embodiments of the present disclosure, the coil, the inductor or the transformer can be connected to circuits (not shown) integrated in the semiconductor package device 7 to form a transmitter or a receiver. Alternatively, the coil, the inductor or the transformer can be connected to circuits exterior to the semiconductor package device 7 to form a transmitter or a receiver.

As shown in FIG. 6, the semiconductor package device 7 can receive or transmit magnetic field in two directions (i.e., the direction perpendicular to the surface defined by the conductive pattern 70a and the surface defined by the conductive pattern 71a). In comparison with the semiconductor package device having only one surface with a conductive pattern, the semiconductor package device 7 shown in FIG. 6 can be design or placed more flexible to receive or transmit the magnetic field. In addition, the semiconductor package device 7 shown in FIG. 6 has better communication quality in the case that the transmitter and the receiver are misaligned.

Figure 7:
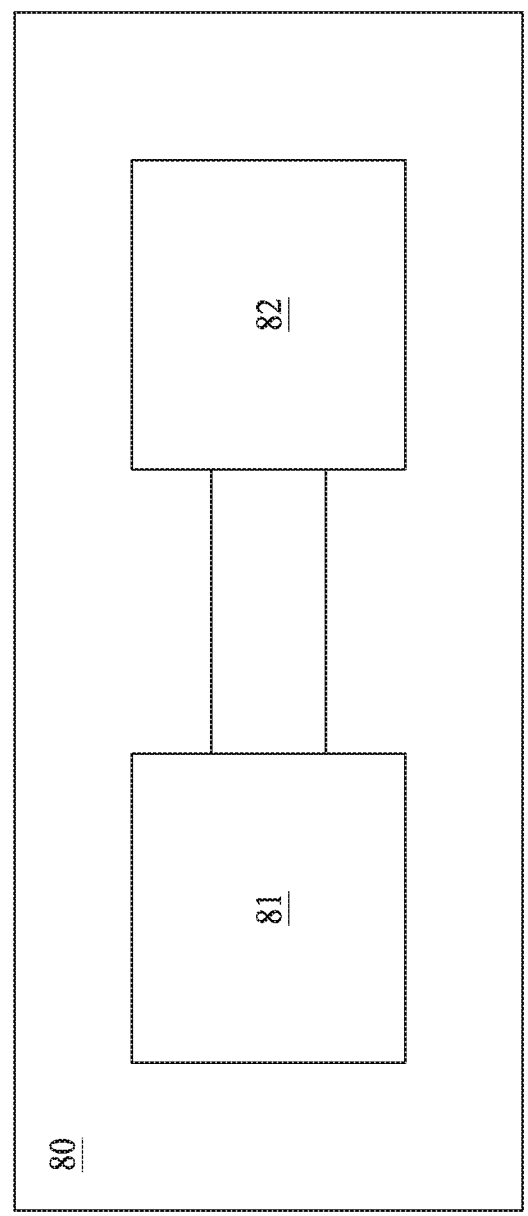
FIG. 7 is a block diagram of a semiconductor device, in accordance with some embodiments.

FIG. 7 illustrates a block diagram of a semiconductor device 8 in accordance with some embodiments of the present disclosure. The semiconductor device 8 comprises a carrier 80, an integrated circuit (IC) 81 and an inductor 82.

The carrier 80 may be a substrate or a printed circuit board, such as a ceramic substrate, a paper-based copper foil laminate, a composite copper foil laminate, or a polymer-impregnated glass-fiber-based copper foil laminate. Alternatively, the carrier 80 may be any dielectric layer, such as boro-phospho-slilicate-glass (BPSG), silicon oxide, silicon nitride, silicon oxynitride, undoped Silicon Glass (USG), any combination thereof, or the like.

The IC 81 is on the carrier 80. The IC 81 may include any of active components, passive elements and the combination thereof. The IC 81 may be connected to the carrier 80 through flip-chip or wire-bond technique.

The inductor 82 is on the carrier 80 and is located exterior to the IC 81. The inductor 82 is electrically connected to the IC 81. In some embodiments, the inductor 82 is any of the semiconductor device package shown in FIGS. 1A and 2-6. Alternatively, the inductor 82 may be any kind of inductor. The inductor 82 includes two terminals, one receiving an input of electrical current, for example, from the IC 81, and the other with the electrical current flowing back to the IC 81. In some embodiments, the two terminals of the inductor 82 are coupled with the IC 81. In some embodiments, the inductor 82 has a dimension comparable to that of the IC 81.

In view of the above, a preferred aspect of the present disclosure is to provide a wafer level package (WLP) inductor. By providing conductive pattern on at least two surfaces of the semiconductor package device, in accordance with some embodiments of the present disclosure, the inductor transmit or receive magnetic field in multiple directions. Therefore, the transmitter or receiver can have better communication quality and reduce the transmission error due to the misalignment of the transmitter and receiver.

Some embodiments of the present disclosure provide an inductor structure. The inductor structure, comprising a first surface, a second surface intersecting with the first surface, a first conductive pattern and a second conductive pattern. The first conductive pattern is formed on the first surface. The second conductive pattern is formed on the second surface. The first conductive pattern is connected with the second conductive pattern.

Some embodiments of the present disclosure provide an inductor structure. The inductor structure comprises a first conductive pattern, the first dielectric layer and a second conductive pattern. The first conducive pattern has a plurality of conductive metals. The first dielectric layer encapsulates the first conductive pattern. The second conductive pattern is on the first dielectric layer. The second conductive pattern is electrically connected with a first conductive metal and a second conductive metal of the first conductive pattern.

In some embodiments of the present disclosure, an inductor structure comprises a first carrier, a first conductive pattern, a second carrier and a second conductive pattern. The first carrier has a first surface. The first conductive pattern is on the first surface of the first carrier. The second carrier is at one edge of the first carrier. The second carrier has a second surface substantially perpendicular to the first surface of the first carrier. The second conductive pattern is on the second surface of the second carrier. The second conductive pattern is electrically connected with the first conductive pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure and that they may make various changes, substitutions, and alterations herein without departing from the spirit and scope of the present disclosure.

What is claimed is:

1. An inductor structure, comprising:
a first surface and a second surface intersecting with the first surface;
a first conductive pattern on the first surface, comprising a plurality of first conductive metals;
a second conductive pattern on the second surface, comprising:
a plurality of conductive contacts, each in direct contact with one of the plurality of the first conductive metals on the first surface; and
a plurality of second conductive metals, each perpendicular to one of the plurality of conductive contacts on the second surface, and each having a distance to the first surface different from others of the plurality of second conductive metals.

2. The inductor structure of claim 1, further comprising a third conductive pattern formed on a third surface of the semiconductor package structure, the third surface being opposite to the second surface, wherein the third conductive pattern is connected with the first conductive pattern.

3. The inductor structure of claim 2, further comprising a fourth conductive pattern formed on a fourth surface of the semiconductor package structure, the fourth surface being opposite to the first surface, wherein the fourth conductive pattern is connected with the second conductive pattern and the third conductive pattern.

4. The inductor structure of claim 2, further comprising a fifth conductive pattern formed on a fifth surface of the semiconductor package structure.

5. The inductor structure of claim 4, further comprising a sixth conductive pattern formed on a sixth surface of the semiconductor package structure, the sixth surface being opposite to the fifth surface, wherein the sixth conductive pattern is connected with the first conductive pattern.

6. The inductor structure of claim 1, wherein the first conductive pattern or the second conductive pattern is spiral.

7. The inductor structure of claim 1, wherein the second conductive pattern comprises redistribution layers (RDL).

8. The inductor structure of claim 7, wherein the first conductive pattern, the second conductive pattern, and the through via structure form a conductive loop.

9. The inductor structure of claim 7, wherein the inductor structure comprises:
a first terminal receiving an input current from the integrated circuit; and
a second terminal sending an output current to the integrated circuit.

10. An inductor structure, comprising:
a first conductive pattern having a plurality of conductive metals;
a first dielectric layer encapsulating the first conductive pattern; and
a second conductive pattern on the first dielectric layer;
wherein the second conductive pattern is electrically connected with a first conductive metal and a second conductive metal of the first conductive pattern,
wherein the plurality of the conductive metals of the first conductive pattern are substantially parallel to each other, and the second conductive pattern is substantially perpendicular to the plurality of conductive metals of the first conductive pattern.

11. The inductor structure of claim 10, wherein the second conductive pattern are electrically connected to the first conductive pattern through conductive contacts.

12. The inductor structure of claim 10, wherein the conductive conducts are parallel to each other, and the first conductive pattern or the second conductive pattern is spiral.

13. The inductor structure of claim 10, further comprising
a second dielectric layer on the first dielectric layer to encapsulate the second conductive pattern;
a third conductive pattern on the second dielectric layer; and
wherein the third conductive pattern is electrically connected with a third conductive metal and a fourth conductive metal of the first conductive pattern.

14. The inductor structure of claim 13, wherein the third conductive pattern is substantially parallel to the second conductive pattern.

15. The inductor structure of claim 13, wherein the third conductive pattern is electrically connected to the first conductive pattern through conductive contacts and wherein the conductive contacts are parallel to each other.

16. The inductor structure of claim 10, wherein the first dielectric layer comprises molding compounds, pre-impregnated composite fibers, boro-phospho-slilicate-glass, silicon oxide, silicon nitride, silicon oxynitride, undoped silicon glass or any combination thereof.

17. The inductor structure of claim 10, wherein the second conductive pattern comprises redistribution layers (RDL).

18. A semiconductor structure, comprising:
a carrier having a top surface;
an integrated circuit on the top surface of the carrier;
an inductor structure on the top surface of the carrier and adjacent to the integrated circuit, the inductor structure comprising:
a first surface coplanar with the top surface of the carrier;
a second surface parallel to the first surface;
a first conductive pattern on the first surface;

a second conductive pattern on the second surface,
wherein the first conductive pattern is connected with the second conductive pattern by a through via structure on a third surface, the third surface being perpendicular to the first surface and the second surface.

19. The semiconductor structure of claim 18, wherein the first conductive pattern comprises a plurality of first conductive metal parallel to each other.

20. The semiconductor structure of claim 18, wherein the second conductive pattern comprises a redistribution layer (RDL).

* * * * *